United States Patent [19]

Bealkowski et al.

[11] Patent Number: 5,327,531
[45] Date of Patent: Jul. 5, 1994

[54] DATA PROCESSING SYSTEM INCLUDING CORRUPT FLASH ROM RECOVERY

[75] Inventors: Richard Bealkowski, Delray Beach; Dhruvkumar M. Desai, Boynton Beach; Robert B. Haig, Delray Beach; Dennis L. Moeller, Boca Raton; Essy Tashakori, Delray Beach, all of Fla.

[73] Assignee: International Business Machines Corp., Armonk, N.Y.

[21] Appl. No.: 948,053

[22] Filed: Sep. 21, 1992

[51] Int. Cl.5 .............................................. G06F 15/62
[52] U.S. Cl. .................................... 395/164; 395/162; 395/575; 395/700; 371/10.1; 371/12; 364/268; 364/269.2; 364/280.2; 364/280.3
[58] Field of Search ................................. 395/162-166, 395/425, 575, 700; 364/280.2, 280.3, 286.5, 268.1, 269.2, 268; 345/201; 371/10.1, 10.2, 12, 13

[56] References Cited

U.S. PATENT DOCUMENTS 5,163,052 11/1992 Evans et al. ...................... 364/269.2
5,239,621 8/1993 Brown, III et al. ................ 395/115
5,261,104 11/1993 Bertram et al. ..................... 395/700

Primary Examiner—Robert L. Richardson
Assistant Examiner—Kee M. Tung
Attorney, Agent, or Firm—Daniel E. McConnell

[57] ABSTRACT

A personal computer is provided with primary and secondary non-volatile storage devices for initializing the system when power is turned on. The primary device is a flash RAM. A flash ROM memory controller include means to detect when the flash ROM becomes corrupted and to switch over to the secondary device for initialization allowing the flash ROM to be later reprogrammed.

9 Claims, 3 Drawing Sheets

DATA PROCESSING SYSTEM INCLUDING CORRUPT FLASH ROM RECOVERY

BACKGROUND OF THE INVENTION

This invention relates to the field of data processing, and, more particularly to improvements in recovering from a corrupt flash read only memory (ROM).

A flash ROM is a relative new storage device available for the non-volatile storage of power-on self-test (POST) and basic input/output system (BIOS) programs, and other microcode, required for system initialization. A flash ROM is an alternative to using electronically programmable read only memories (EPROM) that are used for the same purposes. A flash ROM can be reprogrammed without being removed from the system, providing a more expeditious and less costly solution over EPROMS when field updates are required. The only disadvantage to such solution is if the flash ROM becomes corrupted such as by a power loss during reprogramming, in which case there is no way to initialize the system again to reprogram the flash RAM if the system has only one initialyzing resource.

In one prior art system, both a flash ROM and an EPROM are installed in the system as primary and secondary storage resources respectively, and a hardware jumper is provided to select which resource is used to initialize the system. If the flash ROM becomes corrupted, someone (such as a systems engineer or a skilled user) must manually move the jumper to select the EPROM, power on the system and wait for it to initialize, move the jumper back to select the flash RAM, and then reprogram the flash ROM by a software utility. Although such solution works, the cost associated with it is high in terms of system down time, labor to switch the jumper, and cost of jumper itself.

SUMMARY OF THE INVENTION

One of the objects of the invention is to provide a personal computer system having primary and secondary non-volatile storage devices, including on or more flash RAMs, for storing initialization information, with improved means to recover from a flash ROM that is corrupted while being reprogrammed or updated.

Another object of the invention is to provide an automatic flash ROM recovery system for recovering from a corrupted flash RAM, which does not involve a jumper and the manual switching thereof.

A further object of the invention is to provide a flash ROM recovery system in which the system automatically determines and selects which resource is used to initialize the system when the flash ROM is by default the primary resource for initializing the system, the system automatically switching to the secondary resource if the primary flash ROM has been corrupted.

Still another object of the invention is to provide an improved flash ROM recovery system which can recover from a corrupted primary flash ROM by first initializing the system using a secondary initializing resource and then reprogramming the flash ROM without any intervention by a systems engineer of other skilled person.

Briefly, in accordance with the invention, a personal computer is provided with primary and secondary non-volatile storage devices for initializing the system when power is turned on. The primary device is a flash RAM. A flash ROM memory controller include means to detect when the flash ROM becomes corrupted and to switch over to the secondary device for initialization allowing the flash ROM the be later reprogrammed.

DRAWINGS

Other objects and advantages of the invention will be apparent from the following description taken in connection with the accompanying drawings wherein.

DETAILED DESCRIPTION

Figure 1:
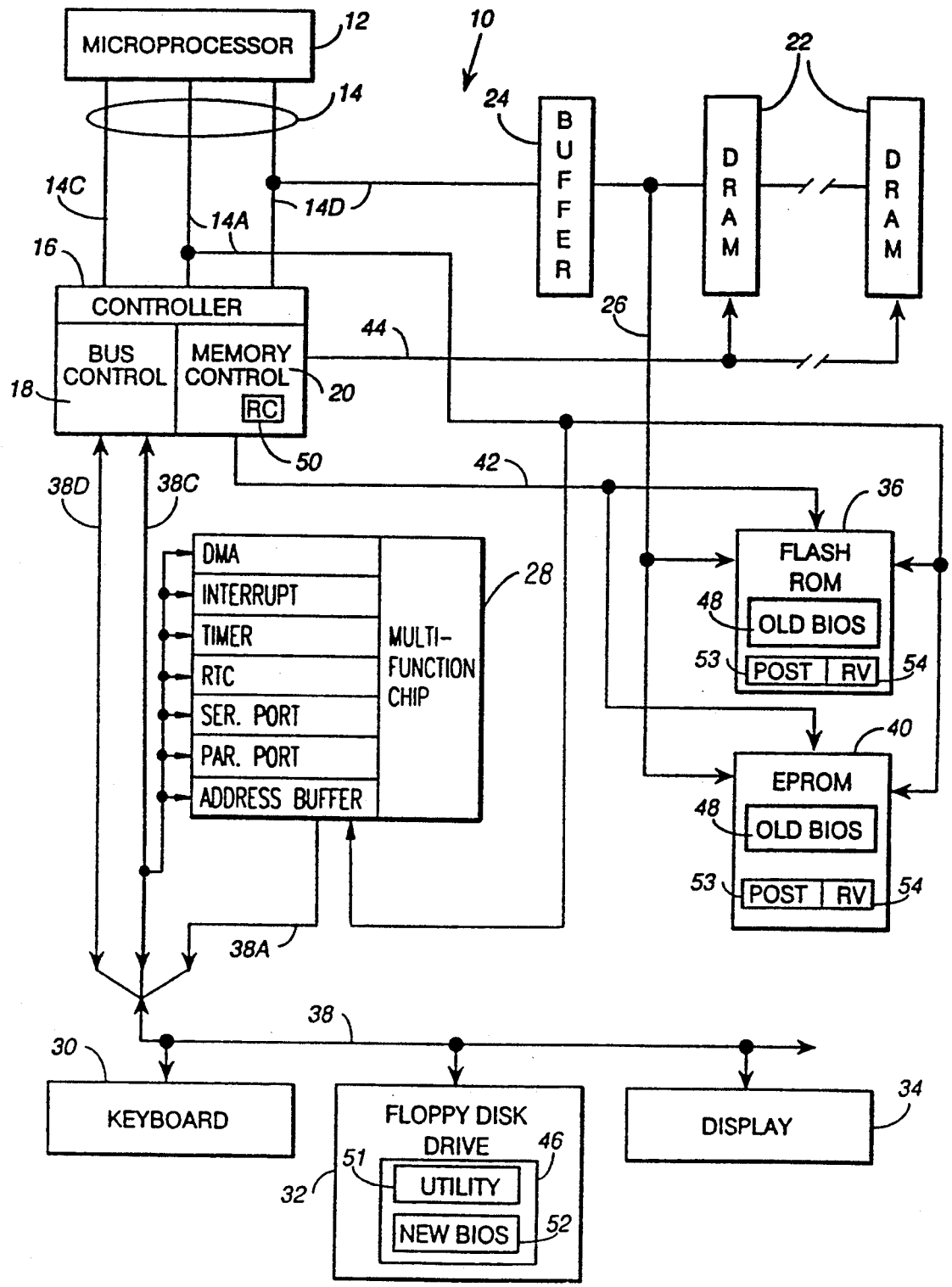
FIG. 1 is a block diagram of a data processing system embodying the invention.

Referring now to the drawings, and first to FIG. 1, a personal computer system 10 comprises a microprocessor 12 connected by a local bus 14 to a controller 16. Local bus 14 includes a data bus 14D, an address bus 14A, and a control bus 14C each of which has a plurality of lines for transmitting data, address, and control signals. Preferably, the microprocessor is a standard, commercially available 386sx microprocessor and local bus 14 conforms to the architecture thereof including a 24-bit address bus and a 16-bit data bus. Controller 16 comprises a bus control unit 18 and a memory control unit or controller 20. Controller 20 controls access to and operation of a main memory 22 composed of a plurality of dynamic random access memory (DRAM) devices. A data buffer 24 is connected to bus 14D and to the DRAMs. A memory bus 44 is connected between controller 20 and DRAMs 22 for transmitting the row address, column address, and control signals for accessing the main memory.

Bus control 18 provides an interface between local bus 14 and an expansion bus 38 that comprises address, data, and control busses 38A, 38D and 38C. A standard keyboard 30, floppy disk drive 32, and display 34 are also connected to bus 38 to provide I/O functions allowing user interaction with the system. A multifunction chip 28 is also connected to bus 38C and provides the functions of a direct memory access (DMA) controller, interrupt controller, time, real time clock (RTC), serial port, and parallel port. Chip 28 also includes an address buffer connected to busses 14A and 38A.

System 10 further includes a flash ROM 36 and an EPROM 40 which respectively act as the primary resource and the secondary resource for non-volatile storage of information for initializing the system when the system power is turned on. Both devices 36 and 40 are initially programmed with the same initializing information including a POST program 53, a BIOS 48, and a reset vector (RV) 54. When the system is powered on, control passes to RV 54 which is at a predetermined location in the primary resource 36. RV 54 is a jump instruction for causing control to pass to the POST program for testing and starting up the system in a standard manner. EPROM 40 is a secondary or backup resource and is used as an alternate resource in the manner described below when ROM 36 becomes corrupted. Flash ROM 36 and EPROM 40 are connected to address bus 14A to receive addresses therefrom, and to control bus 42 to receive control signals from memory controller 20, and to data bus 26. Bus 26 is in turn connected to data buffer 24.

Figure 2:
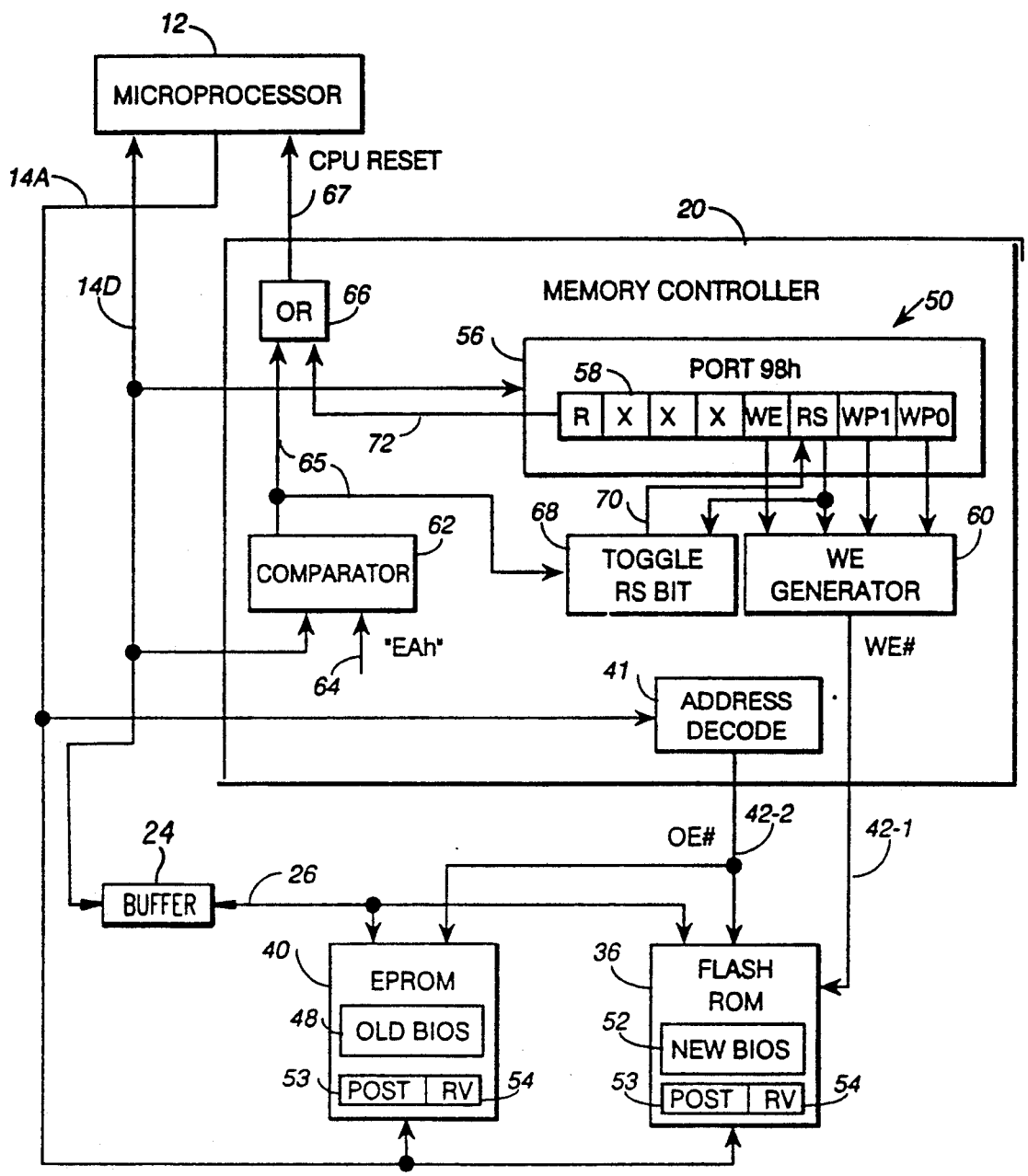
FIG. 2 is a more detailed block diagram of a memory controller shown in FIG. 1.

System 10 is designed in contemplation of the possibility that the initial BIOS 48 in ROM 36 may be updated with the aid of a software utility 51 on a floppy disk 46 that also stores a new BIOS 52. Utility 51 is a program that when executed first erases flash ROM 36, and then writes the new BIOS 52 into the flash ROM. Such update process is relatively slow and takes several minutes to complete. The problem which the invention addresses and solves is the situation of the flash ROM becoming corrupted as a result a power loss during the update process. In such a situation, the old contents of the ROM have been erased and the new BIOS has not been stored therein so that subsequent system initialization cannot occur using a corrupted ROM. The solution to the problem, in accordance with the invention, is to include in memory controller 20 a recovery control (RC) 50 details of which are shown in FIG. 2 to which reference is now directed.

Recovery control 50 comprises a port 56 accessible at port address "98h" (hex) Port 56 contains an eight bit register 58 having three bits X that are unused by the invention, a reset bit "R", a write enable bit "WE", a ROM select bit "RS", and two write protect bits "WP0", "WP-1". Port 56 is connected to data bus 14D allowing information to be written into and read from register 58, by the system. During the normal operation of system 10, during system initialization, R bit is reset or "off", WE bit is off, RS bit is set on to select flash ROM 36, and WP0 and WP1 are on to write protect 36 and 40. During a BIOS update, these bits are set by utility 51 to the following states: R-off, WE-on, RS-on to select ROM 36, WP0-off to allow ROM 36 to be written into, and WP-1-on. At the successful completion of the update process, flash ROM 36 contains the new BIOS 52, POST 48, and reset vector 54. Reset vector 54 is located at address "FFFFF0h" and contains a jump instruction having an op code "EAh" in the low order byte thereof along with a "jump to" address for jumping or branching to a program that continues with initialization of the system including executing the POST program. A write enable bit generator 60 has four inputs connected to read the status of the WE, RS, WP1 and WP0 bits. The logic of generator is to generate a WE# signal only when WE is on, RS is on, WP1 is on, and WP0 is off, thereby allowing flash ROM to be reprogrammed. In order to update flash ROM 36, the software utility 51 is mounted in drive 32 and selected or activated. The utility is loaded into main memory 22 and executed causing register 58 to be loaded with the above bit settings allowing the flash ROM to be reprogrammed. Upon completion of the reprogramming, ROM 36 contains the initialization information illustrated in FIG. 2.

Controller 20 also includes means to detect a corrupted flash ROM, which means includes a comparator 62 having a first one byte input 64. Such input is preset to the value 'EAh" which corresponds to the lower order byte of RV 54. In accordance with the invention, when the system is first turned on, the microprocessor fetches or reads the instruction at ROM address "FFFFF0h" from ROM 36 into microprocesser 12 for execution. Such address is transmitted from the microprocessor along address bus 14A to an address decoder 41 that generates a chip enable bit OE# for accessing ROM 36. The instruction is transferred on bus 14D which is connected to comparator 62 so as to allow the low order byte to be compared with the preset value on input 64. If the two values are the same, the instruction is executed and processing continues in a normal manner. If the low order byte from ROM 36 is not "EAh", it indicates a corrupted ROM.

Comparator 65 has an output connected to line 65 and generates a CPU RESET signal on line 65 when the low order byte being transferred does not equal "EAh". Line 65 is connected to one input of a two input OR logic circuit 66 and to a toggle RS bit circuit 68. The second input of OR circuits 66 is connected to the R-bit of register 58. Circuit 66 has an output connected by line 67 to the CPU RESET input of microprocessor 12 whereby the microprocessor is reset either when comparator 62 generates a CPU RESET signal or when the R-bit is set on. Circuit 68 has a second input connected to read the RS-bit of register 56 and is operative to generate an output signal on line 70 for toggling RS-bit when such bit is on and a CPU reset signal is generated by comparator 62. In response to the CPU RESET signal, bit RS is saved so that on the subsequent system startup, EPROM 40 is used to initialize the system instead of flash ROM 36.

Figure 3:
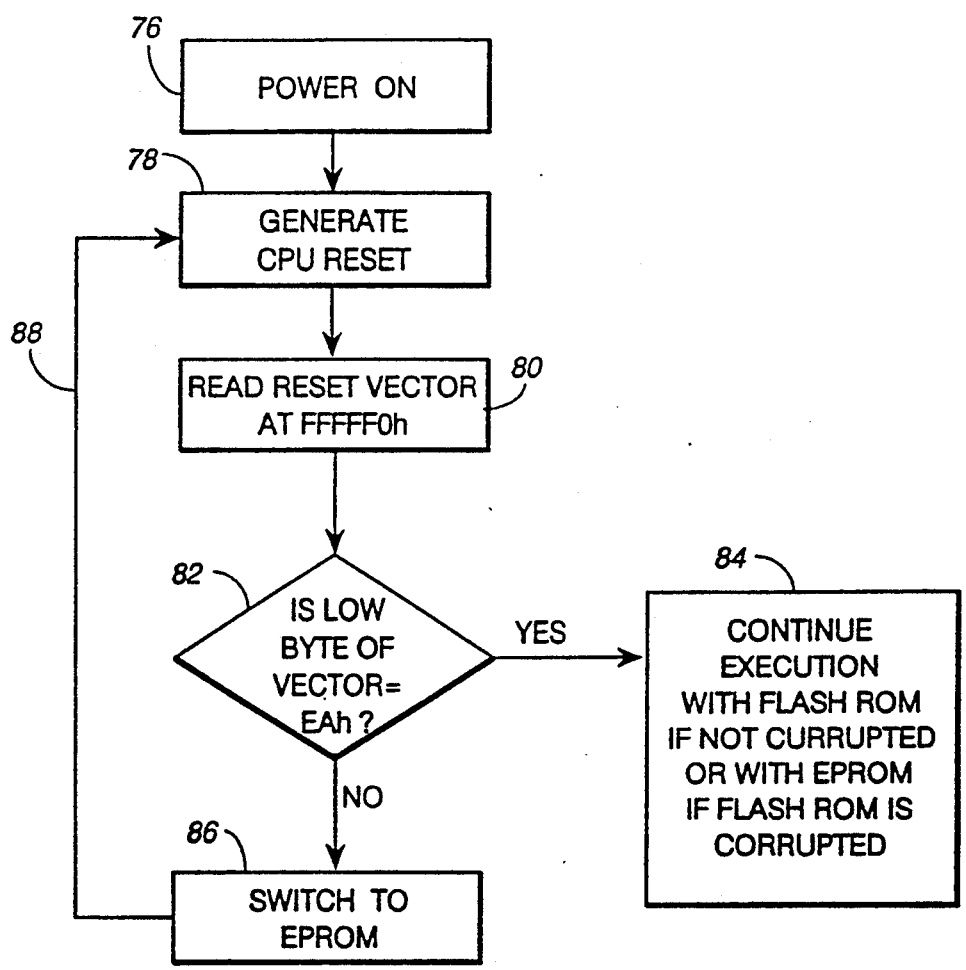
FIG. 3 is a flow chart of update and recovery operations in accordance with the invention.

Referring to FIG. 3, when the system power is turned on in step 76, two different sequences of operation can occur dependent on whether or not the flash ROM has been corrupted. If the flash ROM is not corrupted, the CPU is reset in step 78. Step 80 then reads the reset vector 54 in ROM 36 and step 82 compares the low order byte with the value "EAh". Since the flash ROM is not corrupted, step 82 provides a positive determination and step 84 continues executing the initialization code in flash ROM 84 in the usual manner. If the flash ROM is corrupted, two passes are made. In the first pass, steps 78 and 80 occur as above, but step 82 then produces a negative determination causing step 86 to toggle the RS bit and select EPROM 40 as the ROM resource for initialization. Control then is passed along path 88 to step 78 which is reexecuted. Afterwards, step 80 reads the reset vector this time from EPROM 40 thereby causing step 82 to produce a positive result. Step 84 then continues initialization by executing initialization code in EPROM. Once EPROM 40 has initialized the system, further attempts can be made to update the flash ROM using the software utility 51, until a successful update occurs. Afterwards, ROM 36 is then set as the primary resource and the new BIOS 52' is placed in operation. It should be noted that the invention automatically allows a flash ROM to be updated, even though it has been corrupted, without requiring a skilled person to manipulate any jumper.

It should be apparent to those skilled in the art that many changes can be made in the details and arrangements of steps and parts without departing from the scope of the invention as defined in the appended claims.

What is claimed is:

1. In a personal computer comprising a non-volatile primary flash read only memory (ROM) for storing initialization information including a first reset vector containing a jump instruction, said flash ROM having a predetermined first location for storing said first reset vector, a non-volatile secondary ROM for storing initialization information including a second reset vector containing a jump instruction for ranching to initialization code, said secondary ROM having a second predetermined location for storing said second reset vector, a microprocessor for reading said first location in response to a CPU reset signal, a memory controller for controlling operation of said flash ROM and said secondary ROM, and bus means interconnecting said microprocessor, said ROMs, and said memory controller, the improvement comprising:

first means in said memory controller connected to said bus means for detecting a corrupted flash ROM, when said microprocessor is reading said first location, and generating a CPU reset signal in response thereto;

second means connected to said first means for receiving said CPU reset signal therefrom and switching said second ROM to become a primary ROM; and third means connected from said first means to said microprocessor for transmitting said CPU reset signal thereto, whereby said microprocessor is reset causing said jump instruction in said second reset vector to be fetched from said second ROM and executed to thereby branch to said initialization code and initialize said personal computer using initialization information in said second ROM.

2. A personal computer in accordance with claim 1 wherein said first means comprises a comparator having a first input for receiving a first operand read from said first location, said comparator having a second input for receiving a second predetermined operand, said comparator being operative to generate said CPU reset signal when said first operand and said second operand are different.

3. A personal computer in accordance with claim 2 wherein said second means comprises:

a selectively actuated storage device for storing a ROM select bit having first and second states, said first state selecting said flash ROM, said second state selecting said second ROM, said ROM select bit being normally set to select said flash ROM, said ROM select bit being toggled from said first state to said second state in response to said CPU reset signal.

4. A personal computer in accordance with claim 3 wherein said second means further comprises a plural bit register containing said ROM select bit and a plurality of additional bits including a write enable bit having two states for controlling enabling of the ROM selected by said ROM select bit.

5. A personal computer in accordance with claim 4 wherein said second means comprises a write enable bit generator connected to said write enable bit for generating a write enable signal and transmitting said write enable signal to said ROM selected by said ROM select bit.

6. A personal computer in accordance with claim 5 comprising:

an addressable port containing said register;

and software means executable by said microprocessor for setting said register to control operation of said flash ROM, for erasing said initialization information in said flash ROM, and for writing updated initialization information into said flash ROM including said first reset vector.

7. A personal computer in accordance with claim 6 wherein said software means is selectively operable when a power loss occurs causing corruption of said flash ROM and when said flash ROM is successfully updated by said software means.

8. A personal computer in accordance with claim 7 wherein said initialization information comprises a power on self test program, and each ROM further comprises a basic I/O system (BIOS) for accessing I/O devices.

9. A personal computer in accordance with claim 2 wherein said first and second reset vectors each contain a predetermined jump instruction having an op code, and said second operant corresponds to said op code.

* * * * *